(12) United States Patent
Fields et al.

(10) Patent No.: US 6,904,397 B1
(45) Date of Patent: Jun. 7, 2005

(54) SYSTEM AND METHOD FOR ASSISTING IN THE DEVELOPMENT AND INTEGRATION OF REUSABLE CIRCUIT DESIGNS

(75) Inventors: Carol A. Fields, Los Gatos, CA (US); Anthony D. Williams, San Bruno, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/510,203

(22) Filed: Feb. 22, 2000

(51) Int. Cl.$^7$ ............................. G06F 17/50; G06F 9/45
(52) U.S. Cl. ............................. 703/14; 703/15; 716/4; 716/5; 716/16
(58) Field of Search ..................... 703/14, 15; 716/4–5, 716/16

(56) References Cited

U.S. PATENT DOCUMENTS

| | | | |
|---|---|---|---|
| 5,557,531 A | * 9/1996 | Rostoker et al. | 716/1 |
| 5,572,437 A | * 11/1996 | Rostoker et al. | 716/18 |
| 5,673,199 A | * 9/1997 | Gentry | 703/1 |
| 5,752,002 A | * 5/1998 | Naidu et al. | 703/14 |
| 5,870,308 A | * 2/1999 | Dangelo et al. | 716/18 |
| 5,933,356 A | * 8/1999 | Rostoker et al. | 703/15 |
| 5,995,736 A | * 11/1999 | Aleksic et al. | 716/18 |
| 6,223,326 B1 | * 4/2001 | Fields et al. | 716/4 |
| 6,269,467 B1 | * 7/2001 | Chang et al. | 716/1 |
| 6,292,765 B1 | * 9/2001 | Ho et al. | 703/14 |
| 6,321,363 B1 | * 11/2001 | Huang et al. | 716/4 |
| 6,539,522 B1 | * 3/2003 | Devins et al. | 716/5 |
| 6,678,645 B1 | * 1/2004 | Rajsuman et al. | 703/20 |

OTHER PUBLICATIONS

Bhasker, J. "Verilog HDL Synthesis: A Practical Primer". Chapter 5, Verification. (c) 1998. pp. 173–190.*
American Heritage Dictionary of the English Language, 4th Ed. (c) 2000. Entries for "database", "link". http://www.d-ictionary. com. Printed Jul. 23, 2004.*
Obuchowicz, T. "Digital Logic Synthesis Using Synopsys and Xilinx—A Tutorial". Jul. 1998, Revised Sep. 7, 2001. Dept. of ECE, Concordia University.*
Xilinx. XAPP 108. "Chip–Level HDL Simulation Using the Xilinx Alliance Series". May 21, 1998. (Version 1.0).*
Elayda, B. and Ramine Roane. Xilinx Synopsys. XAPP 107. "Synopsys / Xilinx High Density Design Methodology Using FPGA Compiler(tm)." Aug. 6, 1998. (Version 1.0).*
IEEE Standard Dictionary of Electrical and Electronics Terms. Dec. 1996. p. 1098. "test bed", "test bench".*
Fields, C.A. "Creating Hierarchy in HDL–Based High Density FPGA Design". Proceedings EURO–DAC '95. Sep. 18–22, 1995. pp. 594–599.*
Doughty, F. "6.111 Introductory Digital Systems Laboratory". Emacs Help page. Jan. 18, 2000. http://sunpal2.mit.edu/6.111.*
"Welcome to Digital Signal Processing Support"—"Intro. to Synopsys to XACT M1 Design Flow", Sep. 6, 1999. http://www.ee.qub.ac.uk/dsp/support/documentation/synopsys_ to _xact/intro_synopsys_xact.html.*
Poterie, B. "Storage Mechanism for VHDL Intermediate Form", Proceedings of the European Design Automation Conference (EDAC), 1990. Mar. 12–15, 1990. pp. 506–510.*

* cited by examiner

Primary Examiner—Kevin J. Teska
Assistant Examiner—Ayal Sharon
(74) Attorney, Agent, or Firm—Edel M. Young; LeRoy D. Maunu; Justin Liu

(57) ABSTRACT

A system and method for developing a reusable electronic circuit design module are presented in various embodiments. In one embodiment, the functional design elements comprising a design module are entered into a database along with documentation elements that describe the design elements. The functional design elements are linked with selected ones of the documentation elements in the database. A testbench is simulated with the design module, and the generated results are stored in a database and linked with the functional design elements. By linking the simulation results, documentation, and design elements, the characteristics of the design module are easily ascertained by a designer who is reusing the design module.

18 Claims, 3 Drawing Sheets

SYSTEM AND METHOD FOR ASSISTING IN THE DEVELOPMENT AND INTEGRATION OF REUSABLE CIRCUIT DESIGNS

FIELD OF THE INVENTION

The present invention generally relates to electronic design tools, and more particularly to assisting in the creation and usage of design modules that are amenable for reuse in other designs.

BACKGROUND

Increasingly complex functions are being implemented in ASIC and field programmable gate arrays (FPGAS) given recent advances in silicon technology. Design trends are shifting toward system-level integration in order to reduce the time-to-market and reduce development costs.

System-level integration relies on reuse of previously created designs, either from within an enterprise or from a commercial provider. The engineering community sometimes refers to these previously created designs as "design modules", "cores" or "IP" (intellectual property). As on-chip processors and large functional blocks become increasingly common, vendors are making complex design modules available for general usage, and companies are making modules for reuse within the respective organizations. These design modules are then integrated into larger systems by end-users.

For reusable design modules to be successful, they must be easy to use. Design modules that are amenable to reuse must be well documented, possess sufficient parameterization, have an understandable structure, follow certain coding guidelines, and be extensible for future usage. Reusable design modules should also have a well-planned and documented testbench. To varying degrees, many commercial and internal design modules satisfy these objectives. However, the process and tools used to create a design module will often limit the ease and extent to which the objectives can be satisfied.

A method that address the aforementioned problems, as well as other related problems, is therefore desirable.

SUMMARY OF THE INVENTION

In various embodiments, the invention provides a method and system for developing a reusable electronic circuit design module and using the design module in a debug mode. In one embodiment, the functional design elements comprising a design module are entered into a database along with documentation elements that describe the design elements. The functional design elements are linked with selected ones of the documentation elements in the database. A testbench is simulated with the design module, and the generated results are stored in a database and linked with the functional design elements. By linking the design elements, documentation, translation results, and simulation results, the characteristics of the design module are easily ascertained by a designer who is reusing the design module.

In another embodiment, a system includes a database, a design inspector, a debugging-support module, and a functional simulator. The database is arranged for storage of the design elements and documentation elements, and the design inspector is coupled to the database. The design inspector links the functional design elements with selected ones of the documentation elements. The debugging-support module is coupled to the simulator and to the database, and generates a netlist from the design module, wherein the netlist is suitable for simulation. The functional simulator is coupled to the debugging-support module and simulates a testbench with the design module, whereby simulation results are generated. The simulation results are entered in the database by the debugging-support module and thereafter linked with the design elements.

The above summary of the present invention is not intended to describe each disclosed embodiment of the present invention. The figures and detailed description that follow provide additional example embodiments and aspects of the present invention.

BRIEF DESCRIPTION OF THE DRAWINGS

Various aspects and advantages of the invention will become apparent upon review of the following detailed description and upon reference to the drawings in which.

DETAILED DESCRIPTION

The present invention is believed to be applicable to the process of creating reusable design modules for a variety of electronic circuit technologies. An example environment for creating design modules for field programmable gate arrays (FPGAs) is used to describe the various embodiments of the invention. While the present invention is not so limited, an appreciation of the present invention is presented by way of specific examples involving FPGAs.

In accordance with various embodiments of the invention, a design inspector tool works in conjunction with a design entry tool to assist in creating design modules that are easy to reuse. Specifically, the design inspector processes a design module to determine whether there is documentation that conforms to specified criteria and whether the design module conforms to other specified design rules. Where the design module fails to conform to the specified criteria, a report is provided so that the deficiency can be remedied. In addition, the design elements that comprise the design module, the associated documentation, translation results, and simulation results are linked in a database to assist in understanding particular aspects of the design in view of simulation results.

The present invention supports two modes of operation. The first mode is a design mode where the first instance of a design module is created for reuse. The initial design module may or may not be part of a fully operational system or integrated with other modules. The second mode is an integration mode where a reusable design module is integrated with other design modules to create a netlist. The netlist is translated and then simulated, wherein the translation results and the simulation results are correlated with the design modules and associated documentation. After creating a physical implementation from the netlist, the physical implementation is simulated, and the simulation results are correlated with the design modules and associated documentation. The final design, as well as the design module as modified, can be saved in a central depository for further reuse.

By inspecting for desired documentation and desired design characteristics at appropriate stages and creating a database of design modules, documentation, netlist, and simulation results, easy-to-reuse design modules can be created.

Figure 1:
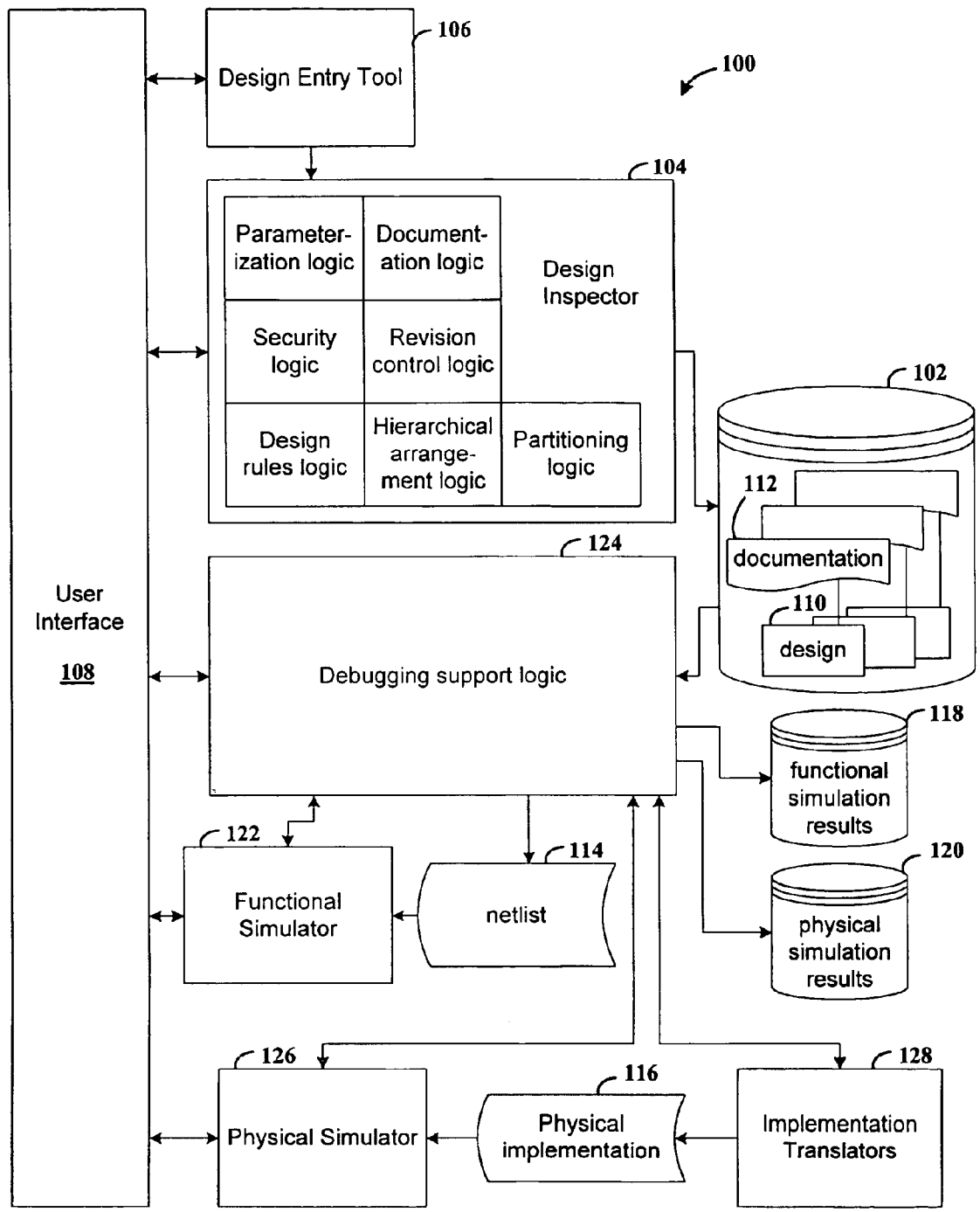
FIG. 1 is a block diagram of a system for creating reusable design modules in accordance with one embodiment of the invention.

FIG. 1 is a block diagram of a system for creating reusable design modules in accordance with one embodiment of the invention. System 100 includes database 102, which includes various design elements and associated documentation elements. Design inspector 104, when activated by the user, examines the design elements for various predefined characteristics. For example, inspector 104 inspects for proper documentation, along with desirable parameterization, security, revision control, hierarchical arrangement, partitioning, and adherence to predetermined design rules, all as embodied in logic within the design inspector.

Design entry tool 106 is used to initially create a design module, and in different embodiments may be an RTL editor, state machine editor, or schematic capture tool, for example. The user interacts with the various components via user interface logic 108, and design inspector 104 can be invoked either via design entry tool 106 or by the user via user interface 108.

Database 102 is created by design entry tool 106 via design inspector 104. Database 102 includes several design elements 110 that comprise a design module. Associated with the design elements are various documentation elements 112. The documentation elements may include, among other items, a datasheet, a functional block diagram, a state diagram, descriptions of blocks, intended usage, parameters that can be modified, effects of modifying parameters, expansion effects, descriptions of input and output signals, description of processing as well as other design descriptive information.

Database 102 not only provides a mechanism to reference documentation associated with various elements of a design, but also provides a mechanism to correlate the design elements and associated documentation with a netlist 114 and physical implementation 116, along with the functional simulation results 118 and physical simulation results 120. Since a design module will undergo various translations, e.g., synthesis, in progressing toward simulation, the translation results are correlated with design elements and associated documentation in order to facilitate debugging a design. Thus, based on the simulation results, a designer can easily reference design information and documentation associated with the implementations.

When a designer is ready to begin testing and debugging a design, a netlist 114 is created. The netlist, along with a suitable testbench (not shown) is used to test the functionality of the design. The testbench is stored in a file which is correlated with the design elements. The design is simulated for functional correctness using functional simulator 122 and applying the testbench. Error and warning messages are written to the database and correlated with the design by debug support logic 124. Example functional simulators include Modelsim from Model Technology and VSS from Synopsys. The data resulting from the simulation is written to functional simulation results file 118.

In order to facilitate debugging, debugging support logic 124 correlates the simulation results from functional simulator 122 with design elements 110 and documentation elements 112 from database 102. For example, if design entry tool 106 is a state machine editor, errors are correlated to possible state or state transitions containing the error. For a schematic capture design entry tool, a correlation of the error to the vicinity of the schematic containing the error is provided. Correlation of simulation results to design elements and documentation elements enables display of the documentation via user interface 108.

Debugging support logic 124 tracks and correlates how the design module is translated. For example, HDL design constructs are traced from high-level design to design elements. In schematic C, any changes made by a translation tool are tracked.

After the errors discovered in the functional simulation have been corrected, the design can be physically implemented via implementation translators 128. Example translators include DC2NCF, NGD2VHDL, and NGDZVER translators from Xilinx. Physical implementation 116 is a netlist, for example.

Physical simulator 126 runs a simulation using a predefined testbench and interfaces with debugging support logic 124 to log the physical simulation results 120. The physical simulation results are also correlated with the design elements and documentation of database 102. By tracking the translation of the design elements from high level design through translation to the physical implementation, the constructs of the high-level design are correlated with elements in the physical implementation. This correlation is then used by debugging support logic 124 to correlate the physical simulation results to the design and documentation elements. In FPGA technology, the representation of the design may differ from the implementation. Tracking the changes as the design elements progress through the translations and correlating the changes to the documentation assists in reuse of a module.

Figure 2:
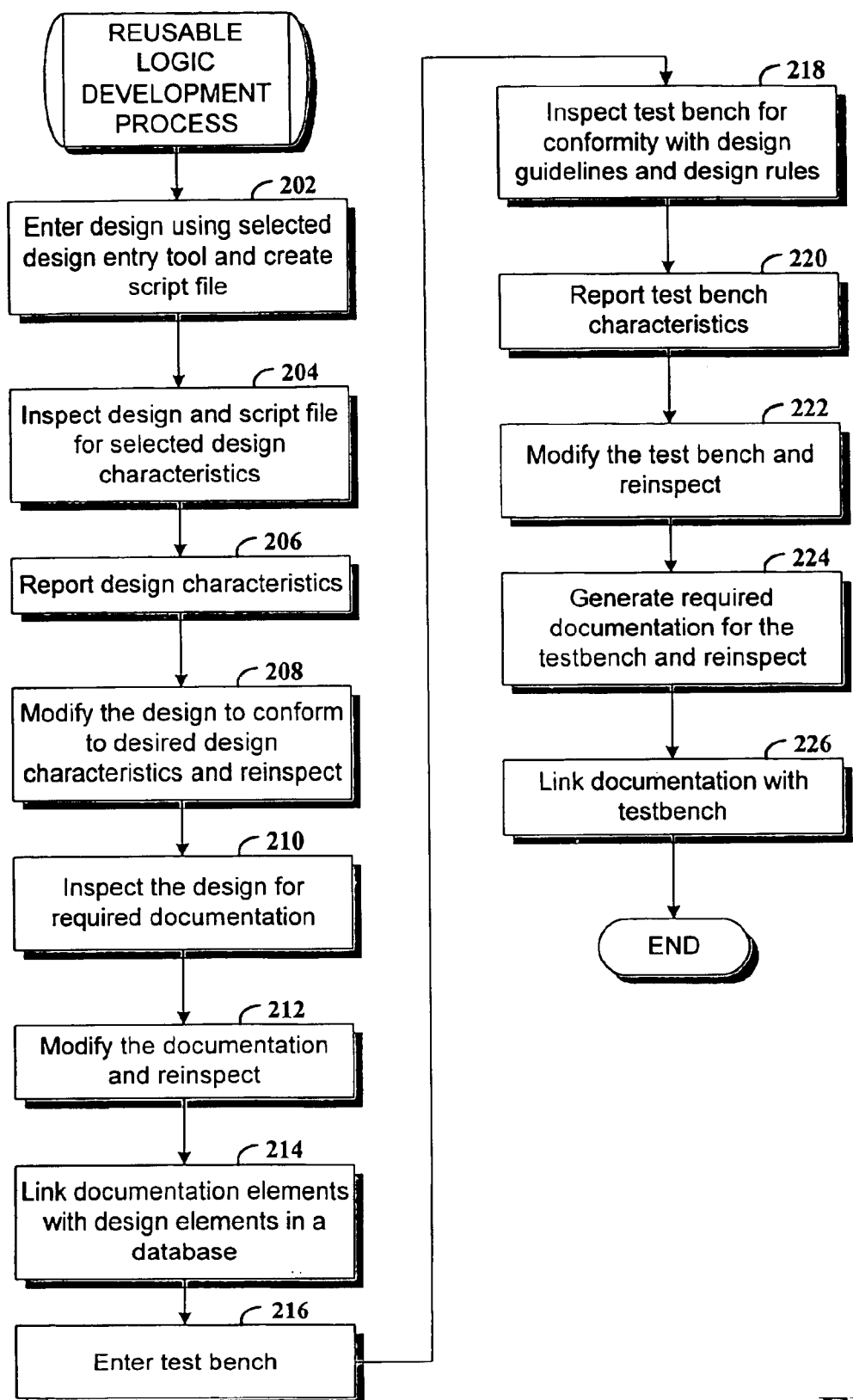
FIG. 2 is a flowchart of an process for developing reusable logic in accordance with one embodiment of the invention.

FIG. 2 is a flowchart of a process for developing reusable logic in accordance with one embodiment of the invention. The process generally entails entering and then inspecting a design module, modifying the design to correct any deficiencies and then re-inspecting. The design module is also inspected for a proper level of documentation. The design elements that comprise the design module and documentation elements that are associated with the design elements are stored in a database for future reference. In addition to the design module, a testbench is created for use with the simulator. The testbench is also associated with the design module for future use.

At step 202, a design module is created using a design entry tool that is adapted to provide the functions of the present invention. A design script is also created by the designer. The design script contains the directives that specify which tools to run, the order in which the tools are to run, as well as options and environment variables for the tools. The design script is stored in a separate file.

The design module and script file are inspected at step 204 for selected design characteristics. For example, the characteristics may include desired parameterization, adherence to specified design rules, and a suitable hierarchical arrangement of the design. In addition, the design inspector checks that all ranges are enumerated and that there is a consistent number of multi-bit objects.

The design inspector is configured to enforce certain design rules. For example, the rules may include a certain number of spaces for indentation of the code, one statement per line, a maximum of 72 characters/line, use of tabs for tabular layout, no usage of abbreviations, capitalization rules, usage of suffixes, reserved uppercase for constants, usage of underscore character for separation of compound words, no misuse of reserved words, usage of "_n". for active low symbols, usage of "clk" prefix for clock signals, usage of a common clock name for all derived and synchronized clock signals, usage of symbolic names to define states in a finite state machine, proper usage of filename extensions for identification of file type, and language specific design rules (e.g., process labels).

For a desired hierarchical arrangement, the design inspector checks whether there are constants that can be changed to variables defined at the top sub-module level, and that there are no more than three levels of nesting. In addition, the design inspector checks that names are preserved across interfaces and hierarchical boundaries. The design inspector may also be programmed to provide a graphical representation of the present hierarchical arrangement to assist in tracking, adding, and deleting sub-modules.

Where the design module fails to conform to the selected characteristics, a report is provided to the designer at step 206. In response to the report by the design inspector, the user may modify the design and then re-inspect (step 208). The modify and re-inspect cycle may be repeated as many times as required to achieve desired design goals.

As part of the re-inspection, the design inspector tracks which of the design elements are changed from the prior inspection and reports which additional design elements are dependent on such changes. For example, changing the value of a constant causes the design inspector to report all sub-modules which use the constant.

At step 210, the design inspector is invoked to check that documentation has been entered for the design module and that the documentation conforms to characteristics imposed by the design inspector. At step 212, the documentation can be entered and/or updated in response to the report provided by the design inspector. Thereafter the design modules can be re-inspected.

There are numerous types of documentation that may be required. Examples include: copyright and confidentiality notices, brief descriptions, revision numbers, past and current authors, change histories, functionality descriptions, descriptions of code structure, variable definitions and side effects, enumeration of valid input data ranges, identifications of parameters not intended to be easily modified, and cross references to applicable industry standards. In addition it may be desirable to require documentation as to the implementation implications of modifying various parameters. For example, expanding a 16×16 multiplier may cause the multiplier to wrap into several columns of configurable logic blocks (CLBs) in a field programmable gate array (FPGA).

Once the desired documentation has been entered, the documentation elements and design elements that comprise the design module are linked in a database. The database provides easy future reference to the design and documentation, such as when the design has been implemented and has undergone several translation and simulation steps.

At step 216, a testbench is entered by the user using conventional tools. The testbench will also be referred to in this document as "simulation elements". Simulation elements are similar to design elements except that they are generated for the purpose of testing the functionality of the design. The testbench is inspected at step 218 by the design inspector, and at step 220, the characteristics of the testbench are reported to the user. The testbench is modified, as may be necessary, at step 222 and then re-inspected. The modify/re-inspect step may be repeated as necessary to correct any deficiencies.

At step 224, the documentation for the testbench is created, and the testbench is re-inspected. Example documentation for testbenches includes: documenting the features included in the testbench, enumeration of assumptions and omissions, description of an input sequence, description of expected output behavior, and a description of anticipated design flow. The elements that comprise the testbench and the associated documentation are added to the design database at step 226. Once the design and testbench have been suitably structured and documented and added to the database, the process is complete. The design module is then in a form that is amenable to reuse.

Figure 3:
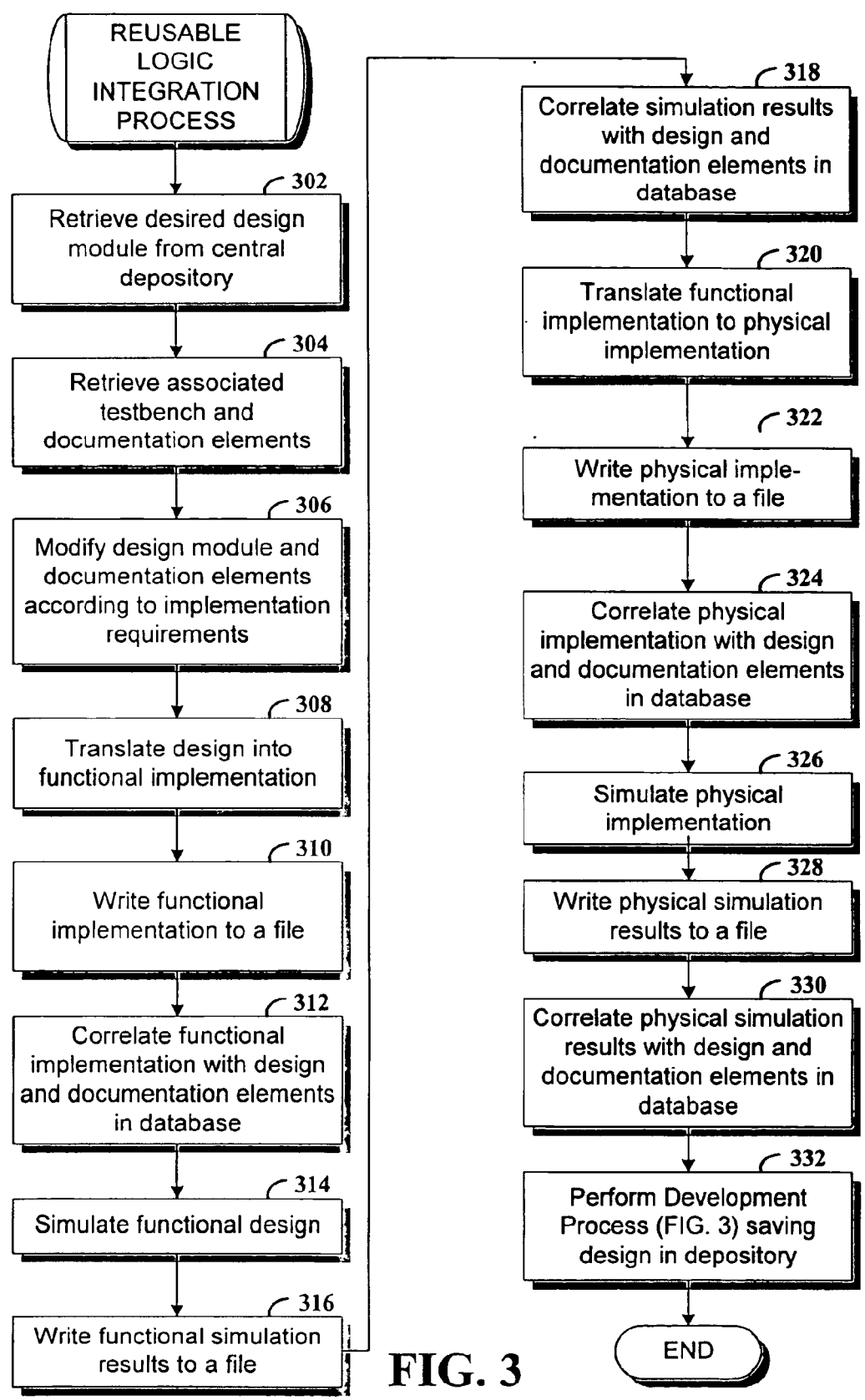
FIG. 3 is a flowchart of a process for integrating reusable logic into a design in accordance with another embodiment of the invention.

FIG. 3 is a flowchart of a process for integrating reusable logic into a design in accordance with another embodiment of the invention. The process generally entails integrating a design module, which was created in accordance with the process of FIG. 2, with other design modules to create a netlist. The resulting logic can then be documented, structured, and inspected to create a design module that can be saved for future integration with still other design modules.

At step 302, the desired design module is retrieved from a central depository. The central depository may be a tree structure of files containing design modules, associated documentation, and test benches. The documentation elements and testbench associated with the selected design module are retrieved at step 304.

The selected design module is modified at step 306 in a manner that is suitable for integration with other design modules. The nature of the modifications to the selected design module is dependent on the function and interfaces of the modules with which the selected module is being integrated. The documentation elements and testbench are also modified as may be necessary.

At step 308, the new design (selected design module as integrated with other design modules) is translated into a netlist. The netlist is then written to a file at step 310. At step 312, the translation results are correlated with the design elements, documentation elements, and testbench elements of the central depository database. In order to correlate elements of the netlist with the original design elements, the elements generated during the translation process are associated in a database with the respective design elements from which they were generated.

The functional design is simulated at step 314, and the simulation results are written to a file at step 316. At step 318, the simulation results are correlated with the design elements, documentation elements, and testbench elements in the central depository database. The correlation provides a mechanism for the designer to trace particular portions of the simulation results back to the original design elements and associated documentation. If an error is discovered during functional simulation, the offending design elements can be changed, saved, re-implemented, and simulated as needed.

At step 320, the functional design is translated into a physical design using conventional tools adapted to work in conjunction with the present invention. The physical implementation is written to a file at step 322, and the physical translation results are correlated with the design elements and documentation elements at step 324.

The following example illustrates the correlation of design elements to physical translation results. The following snippet of VHDL code is taken from a design that implements a state machine.

```
    constant IDLE_CNT    : INTEGER := 8 ;
    ...
    when STABILIZATION_WAIT =>
    ISOLATE         <= TRUE;
    TIMER_TICK      <= CLK_1K;
    if(IDLE_DONE = TRUE) then
        NEXT_STATE <=LINK_WAIT;
    elseif (SCARRIER_PRESENT = TRUE) then
        NEXT_STATE <= VALID_START;
    else
        NEXT_STATE <= STABILIZATION_WAIT;
    endif;
    ...
    process (COUNT)
    begin
        if (COUNT < IDLE_CNT) then
            IDLE_DONE <= '0' ;
        else
            IDLE_DONE <= '1' ;
        end if;
    end process;
    ...
```

In documenting this portion of the design, the designer creates documentation for the design element STABILIZATION_WAIT indicating that a constant $IDLE_{13}$ CNT controls the variable $IDLE_{13}$ DONE, which influences what the transition to the $LINK_{13}$ WAIT state. Further documentation that is associated with $IDLE_{13}$ DONE explains the usage of $IDLE_{13}$ DONE and the implications of changing the constant value.

The following snippet of code sets forth the physical translation results that is generated from the VHDL set forth above.

```
defparam \current_state(0) /G .INIT = 16'hECCC;
X_LUT4 \current_state(0) /G (
    .ADR0 (un26_count_3) ,
    .ADR1 (current_state[6]) ,
    .ADR2 (current_state[0]) ,
    .ADR3 (SCARRIER_PRESENT_c) ,
    .O (\current_state[0]/GROM )
) ;
defparam \current_state(0)/F .INIT = 16'h0001 ;
x_LUT4 \current_state(0) /F (
    .ADR0 (current_state[1]) ,
    .ADR1 (current_state[6]) ,
    .ADR2 (current_state[2]) ,
    .ADR3 (current_state[0]) ,
    .O (\current_state[0]/FROM )
) ;
X_BUF \current_state(0) /XUSED (
    .I (\current_state[0]/FROM ) ,
    .O (ISOLATE_iv)
) ;
X_FF \current_state(0) /FFY/ASYNC_FF (
    .I (\current_state[0] /GROM ) ,
    .CLK (RIC_CLK_c) ,
    .CE (VCC) ,
    .SET (GND) ,
    .RST (\current_state[0] /FFY/ASYNC_FF_GSR_OR ) ,
    .O (current_state[0] )
) ;
```

It can be seen in the physical translation that the state STABILIZATION_WAIT has been renamed. Without correlation between the physical translation results and the functional design element, the designer would be left to determine which elements in the physical translation correspond to the elements in the design. In this example, current_state[0] corresponds to STABILIZATION_WAIT. To assist the designer during test and debug activities, STABILIZATION_WAIT is correlated with current_state [0] by the translators and debugging support logic. Thus, when performing physical simulation, results that reference current_state[0] can be traced by the designer to the state STABILIZATION_WAIT, which has linked documentation that references the constant IDLE_CNT.

The correlation of the physical translation results with the original design elements and documentation elements is especially helpful in the context of designs for programmable logic devices (PLDs). Example PLDs include field programmable gate arrays (FPGAs) that are available from Xilinx. The FPGA-based physical implementation of a design may have little or no resemblance to the original design module. Thus, it is beneficial to correlate elements of the physical translation with the originating design elements and associated documentation elements.

The physical implementation is simulated at step 326, and the simulation results are written to a file at step 328. At step 330, the simulation results are correlated with the design elements and documentation elements. If redesign is necessary, the appropriate design elements can be modified, and the process can be repeated beginning at step 308.

At step, 332, the new design is subjected to the process of FIG. 2. That is, the new design is processed by the design inspector to determine whether the selected design rules and documentation requirements have been adhered to.

Accordingly, the present invention provides, among other aspects, a system and method for creating reusable design modules for electronic circuits. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A computer-implemented method for developing a reusable electronic circuit design module, wherein the design module is comprised of one or more functional design elements comprising the design module, comprising:

entering the functional design elements into database;

entering documentation elements into the database;

linking the functional design elements with selected ones of the documentation elements;

simulating a testbench with the design module, whereby simulation results are generated;

storing the simulation results in the database;

linking the simulation results with the functional design elements;

inspecting the functional design elements for associated documentation; and reporting documentation deficiencies in association with the functional design elements.

2. The method of claim 1, further comprising:

translating the functional design elements into a netlist; and linking elements of the netlist with selected ones of the functional design elements.

3. The method of claim 2, further comprising:

translating the functional design elements into a physical implementation; and linking elements of the physical implementation with selected ones of the functional design elements.

4. The method of claim 1, further comprising:

entering simulation elements in the database; and linking the simulation elements to associated ones of the design elements.

5. The method of claim 4, further comprising:

entering documentation for design script in the database; and linking the documentation of the design script to the design elements comprising the design module.

6. The method of claim 4, further comprising:

entering documentation for the simulation elements in the database; and linking the documentation for the simulation elements with associated ones of the simulation elements.

7. The method of claim 6, further comprising:

inspecting the simulation elements for associated documentation; and reporting documentation deficiencies in association with the simulation design elements.

8. The method of claim 1, further comprising:

inspecting the functional design elements for undesirable design characteristics; and reporting the undesirable design characteristics found in the functional design elements.

9. The method of claim 8, further comprising:

inspecting the functional design elements for undesirable hierarchical characteristics; and reporting discovered ones of the undesirable hierarchical characteristics.

10. The method of claim 8, further comprising:

inspecting the functional design elements for adherence to predefined design rules; and reporting violations of the design rules.

11. The method of claim 10, further comprising providing assistance in specifying the design rules for the functional design elements.

12. The method of claim 8, further comprising:

monitoring changes made to the functional design elements; and indicating which of the functional design elements are dependent on the changes.

13. The method of claim 1, further comprising:

translating the functional design elements into a physical implementation; and linking elements of the physical implementation with selected ones of the functional design elements.

14. The method of claim 1, further comprising requiring specification of parameters at a top level of a hierarchy of the design module.

15. The method of claim 1, further comprising displaying the functional design elements linked to errors in the simulation results.

16. The method of claim 15, further comprising displaying documentation elements associated with errors in the simulation results.

17. An apparatus for developing a reusable electronic circuit design module, wherein the design module is comprised of one or more functional design elements comprising the design module, comprising:

means for entering the functional design elements into a database;

means for entering documentation elements into the database;

means for linking the functional design elements with selected ones of the documentation elements;

means for simulating a testbench with the design module, whereby simulation results are generated;

means for storing the simulation results in the database;

means for linking the simulation results with the functional design elements;

means for inspecting the functional design elements for associated documentation; and means for reporting documentation deficiencies in association with the functional design elements.

18. A system for developing a reusable electronic circuit design module, wherein the design module is comprised of one or more functional design elements comprising the design module, comprising:

a database arranged for storage of the design elements and documentation elements;

a design inspector coupled to the database, the design inspector configured and arranged to link the functional design elements with selected ones of the documentation elements, inspect the functional design elements for associated documentation, and report documentation deficiencies in association with the functional design elements;

a debugging-support module coupled to the simulator and to the database, the debugging-support module configured and arranged to generate a netlist from the design module, wherein the netlist is suitable for simulation;

a functional simulator coupled to the debugging-support module, the simulator configured and arranged to simulate a testbench with the design module, whereby simulation results are generated; and wherein the debugging-support module is further configured and arranged to store the simulation results in the database and link the simulation results with the functional design elements.

* * * * *